(12) United States Patent
Hasegawa et al.

(10) Patent No.: US 10,312,170 B2
(45) Date of Patent: Jun. 4, 2019

(54) SEMICONDUCTOR DEVICE AND SEMICONDUCTOR MODULE PROVIDED WITH SAME

(71) Applicant: Mitsubishi Electric Corporation, Tokyo (JP)

(72) Inventors: Shigeru Hasegawa, Tokyo (JP); Isao Umezaki, Tokyo (JP); Ryo Tsuda, Tokyo (JP); Yukimasa Hayashida, Fukuoka (JP); Ryutaro Date, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/742,608

(22) PCT Filed: Sep. 29, 2015

(86) PCT No.: PCT/JP2015/077426
§ 371 (c)(1),
(2) Date: Jan. 8, 2018

(87) PCT Pub. No.: WO2017/056176
PCT Pub. Date: Apr. 6, 2017

(65) Prior Publication Data
US 2018/0204778 A1    Jul. 19, 2018

(51) Int. Cl.
*H01L 21/31* (2006.01)
*H01L 23/13* (2006.01)
(Continued)

(52) U.S. Cl.
CPC .............. *H01L 23/13* (2013.01); *H01L 24/49* (2013.01); *H01L 25/072* (2013.01); *H01L 25/18* (2013.01);
(Continued)

(58) Field of Classification Search
CPC ................. H01L 25/0657; H01L 25/50; H01L 2225/0651; H01L 2225/06548;
(Continued)

(56) References Cited

U.S. PATENT DOCUMENTS 7,230,273 B2    6/2007 Kitabatake et al.
8,441,075 B2    5/2013 Ishikawa et al.
(Continued)

FOREIGN PATENT DOCUMENTS

JP    08-298788 A    11/1996
JP    2002-033446 A    1/2002
(Continued)

OTHER PUBLICATIONS

International Search Report issued in PCT/JP2015/077426; dated Nov. 17, 2015.
(Continued)

*Primary Examiner* — Elias M Ullah
(74) *Attorney, Agent, or Firm* — Studebaker & Brackett PC

(57) ABSTRACT

It is an object of the present invention to provide a semiconductor device which allows an increase in the number of semiconductor elements mounted in parallel and prevents a shape of an insulating substrate onto which the semiconductor elements are mounted, from being laterally long, and provide a semiconductor module including such semiconductor device. A semiconductor device according to the present invention includes an insulating substrate, a metal pattern which is a continuous piece and is bonded to one main surface of the insulating substrate, and a plurality of switching elements which are bonded to a surface opposite to the insulating substrate on the metal pattern, and the
(Continued)

plurality of switching elements are arranged in a matrix of two or more rows and two or more columns on the metal pattern.

18 Claims, 13 Drawing Sheets

(51) Int. Cl.
- *H01L 25/07* (2006.01)
- *H01L 25/18* (2006.01)
- *H01L 23/00* (2006.01)

(52) U.S. Cl.
CPC ............... *H01L 2224/0603* (2013.01); *H01L 2224/48137* (2013.01); *H01L 2224/4917* (2013.01); *H01L 2924/1203* (2013.01); *H01L 2924/13055* (2013.01)

(58) Field of Classification Search
CPC . H01L 2225/06555; H01L 2225/06586; H01L 2225/06596; H01L 23/13; H01L 24/49; H01L 25/072; H01L 25/18; H01L 2224/0603
See application file for complete search history.

(56) References Cited

U.S. PATENT DOCUMENTS

| | | | |
|---|---|---|---|
| 8,736,043 | B2 | 5/2014 | Konno et al. |
| 9,000,601 | B2 | 4/2015 | Azuma et al. |
| 2013/0249008 | A1 | 9/2013 | Sugimura et al. |
| 2015/0221626 | A1 | 8/2015 | Motowaki et al. |

FOREIGN PATENT DOCUMENTS

| | | |
|---|---|---|
| JP | 2010-232576 A | 10/2010 |
| JP | 2010-251772 A | 11/2010 |
| JP | 2013-012560 A | 1/2013 |
| JP | 2013-021107 A | 1/2013 |
| JP | 2015-142059 A | 8/2015 |
| WO | 2013/140928 A1 | 9/2013 |

OTHER PUBLICATIONS

An Office Action issued by the Japanese Patent Office dated Apr. 3, 2018, which corresponds to Japanese Patent Application No. 2017-542547 and is related to U.S. Appl. No. 15/742,608; with English translation.

F I G. 1
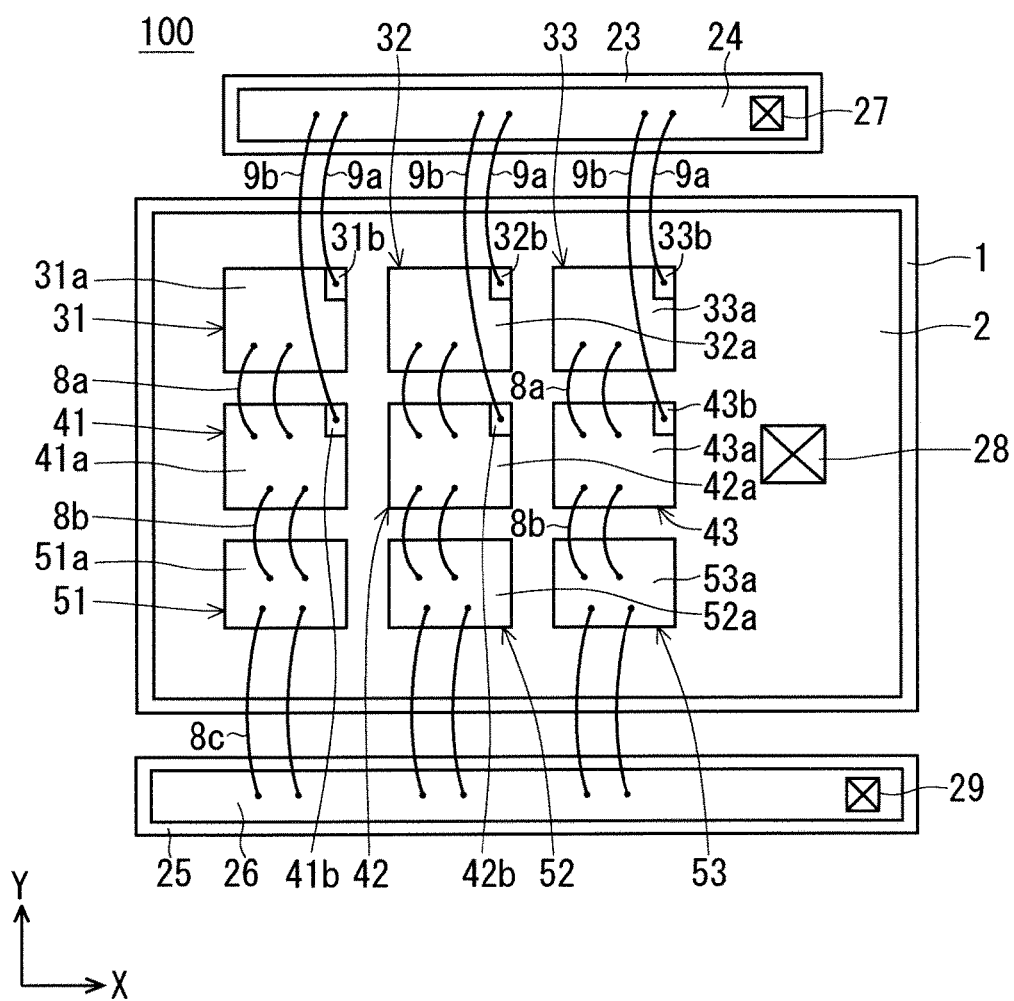

F I G . 5
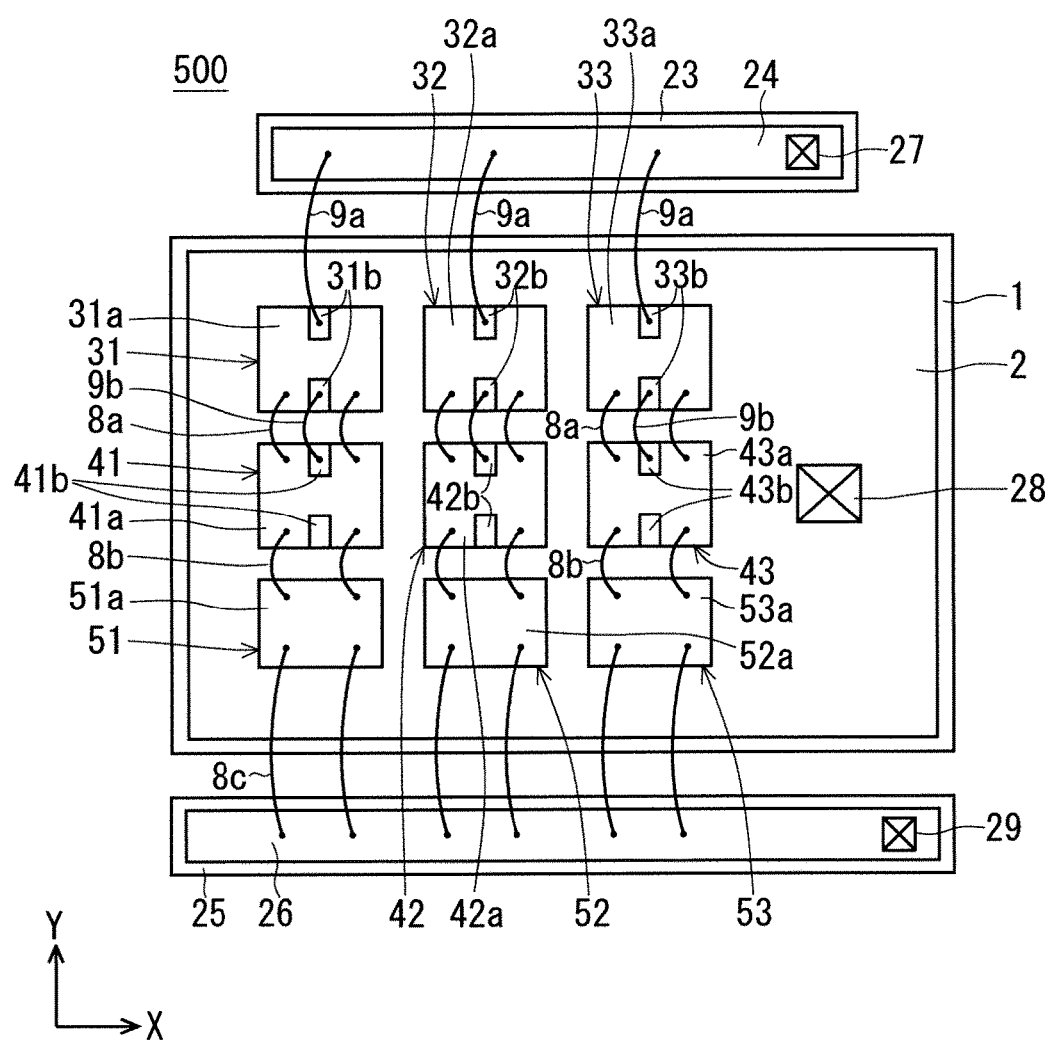

F I G . 1 0
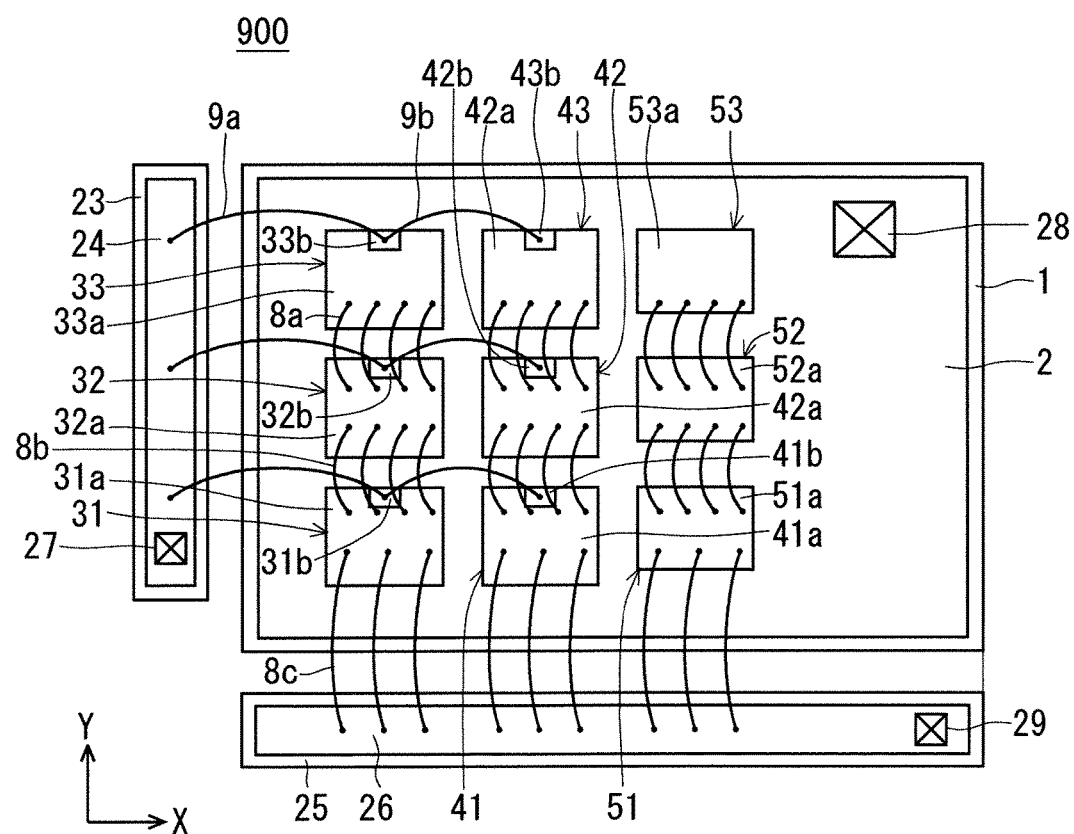

SEMICONDUCTOR DEVICE AND SEMICONDUCTOR MODULE PROVIDED WITH SAME

TECHNICAL FIELD

The present invention relates to a semiconductor device and a semiconductor module including a semiconductor device, and particularly relates to arrangement of switching elements mounted onto the semiconductor device.

BACKGROUND ART

Conventionally, a semiconductor power module is utilized for power control (refer to Patent Document 1, for example). A power device is used in a semiconductor power module. As an example of a power device, an insulated gate bipolar transistor (IGBT) is cited. Tuning-on/off of an IGBT is controlled by a gate driving signal, and high-voltage and large-current switching can be performed. A semiconductor power module including an IGBT is widely used for an inverter which drives a motor or the like, and the like.

PRIOR ART DOCUMENTS

Patent Documents

Patent Document 1: Japanese Patent Application Laid-Open No. 2013-12560

SUMMARY OF INVENTION

Problems to be Solved by the Invention

One among requests made to an IGBT module is an increase in a capacitance of a rated current. For example, in a case where a load with a rated current of 1800 A is driven by using an IGBT module rated at 900 A, two IGBT modules each rated at 900 A should be connected in parallel, for use. Meanwhile, to use an IGBT module rated at 1800 A allows the foregoing load to be driven by using only one IGBT module, which eliminates a need of connecting IGBT modules in parallel, for use.

In order to increase a rated current of one IGBT module, it is required to increase the number of semiconductor elements which are to be connected in parallel and mounted onto an insulating substrate. For example, in a configuration where three IGBT elements are laterally connected in parallel and three diode elements are laterally connected in parallel on one insulating substrate, if six IGBT elements, as well as six diode elements, are laterally arranged, six IGBT elements and six diode elements are included, so that a rated current can be doubled. However, such a configuration as stated above would make a shape of an insulating substrate laterally long significantly. This would make also a shape of a semiconductor module laterally long significantly. A laterally long shape of each of an insulating substrate and a module would cause inconvenience of a remarkably-shortened thermal life or the like, due to an increase in stress resulted from a temperature change during use of a module, or the like.

The present invention has been made in order to solve the above-described problems, and it is an object of the present invention to provide a semiconductor device which allows an increase in the number of semiconductor elements mounted in parallel and prevents a shape of an insulating substrate onto which the semiconductor elements are mounted, from being laterally long, and provide a semiconductor module including such a semiconductor device.

Means for Solving the Problems

A semiconductor device according to the present invention includes: an insulating substrate; a metal pattern which is a continuous piece and is bonded to one main surface of the insulating substrate; a plurality of switching elements bonded to a surface opposite to the insulating substrate on the metal pattern, wherein the plurality of switching elements are arranged in a matrix of two or more rows and two or more columns on the metal pattern. Each of the plurality of switching elements includes: a first main electrode provided in one main surface which is bonded to the metal pattern; a second main electrode provided in the other main surface opposite to the one main surface; and at least one gate electrode provided in the other main surface, and along one direction of a row direction and a column direction, the second main electrodes of the switching elements arranged adjacently are electrically connected by at least one main-current wire.

Effects of the Invention

The semiconductor device according to the present invention makes it possible to obtain a semiconductor device which allows an increase in the number of switching elements and has a high rated current while preventing an insulating substrate from being laterally long significantly, and to obtain a semiconductor module including such a semiconductor device.

The foregoing objects, features, aspects and advantages of the present invention will become more apparent from the following detailed description of the present invention when taken in conjunction with the accompanying drawings.

BRIEF DESCRIPTION OF DRAWINGS

FIG. 1 is a plan view of a semiconductor device according to a first embodiment.

FIG. 5 is a plan view of a semiconductor device according to a fifth embodiment.

FIG. 10 is a plan view of a semiconductor device according to a ninth embodiment.

DESCRIPTION OF EMBODIMENTS

Basic Art

Figure 14:
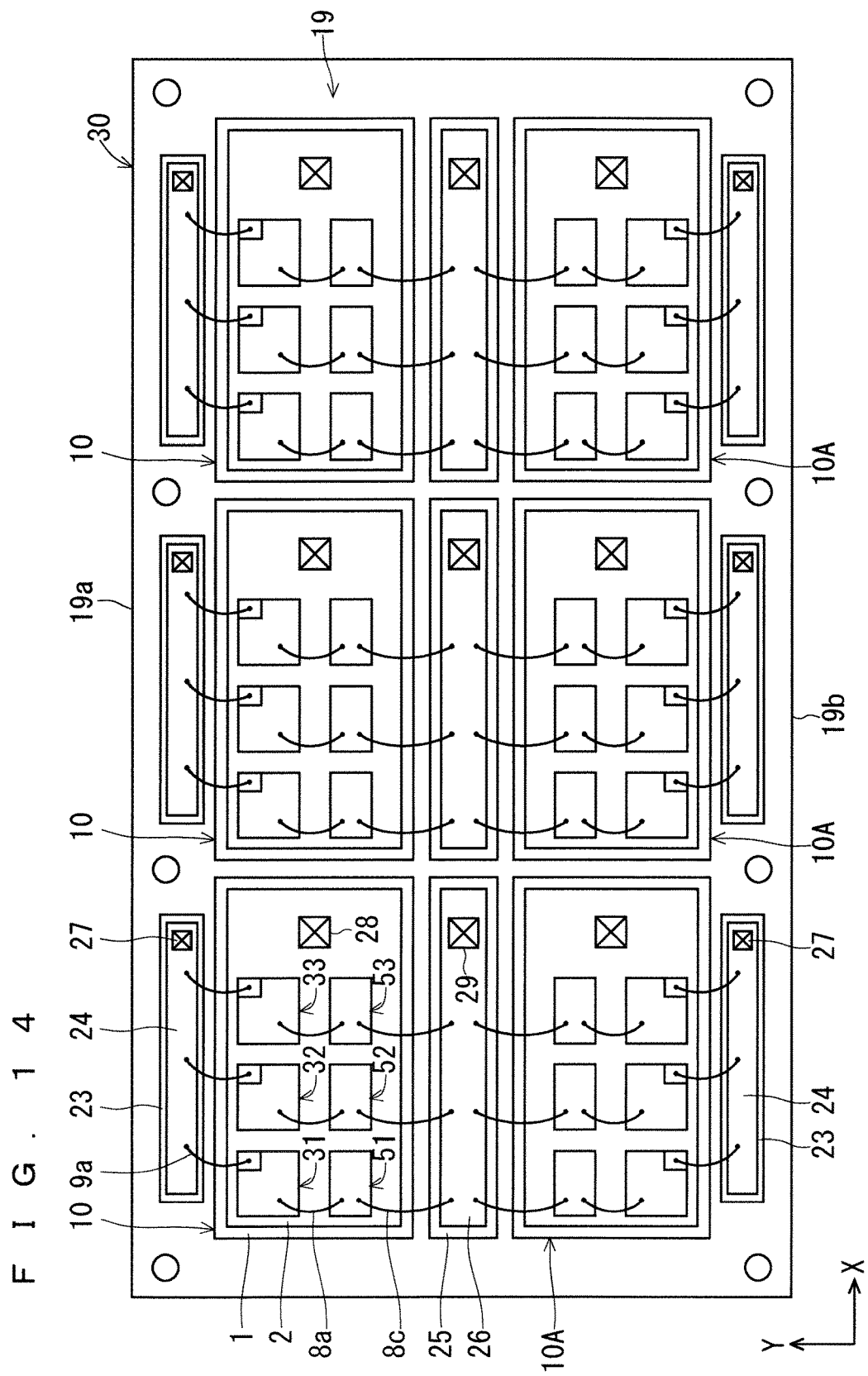
FIG. 14 is a plan view of a semiconductor module and a semiconductor device according to basic art.

Before describing embodiments of the present invention, art on which the present invention is based will be described. FIG. 14 is a plan view showing an internal structure of a semiconductor module 30 according to the basic art. As shown in FIG. 14, the semiconductor module 30 in the basic art includes a plurality of semiconductor devices 10 and 10A and a plurality of metal patterns 24 and 26, which are mounted on a base plate 19.

In a region closer to a first side 19a of the base plate 19, three semiconductor devices 10 having the same configuration are mounted while being arranged along an X direction. Also, in a region closer to a second side 19b opposed to the first side 19a of the base plate 19, three semiconductor devices 10A each having a configuration which is symmetrical to the semiconductor device 10 are mounted while being arranged along an X direction. In other words, three pairs each composed of the semiconductor devices 10 and 10A are mounted.

Between each of the semiconductor devices 10 and the first side 19a of the base plate 19, the metal pattern 24 bonded onto an insulating substrate 23 is mounted. Also, between each of the semiconductor devices 10A and the second side 19b of the base plate 19, the metal pattern 24 bonded onto an insulating substrate 23 is mounted. A lower end of a gate auxiliary electrode 27 is bonded to each of the metal patterns 24 by solder, for example.

Also, on the base plate 19, the metal patterns 26 bonded onto insulating substrates 25 are mounted between the semiconductor devices 10 and the semiconductor devices 10A which are paired with each other, respectively. A lower end of an emitter main electrode 29 is bonded to each of the metal patterns 26 by solder, for example.

Below, the semiconductor device 10 will be described. In the semiconductor device 10, a metal pattern 2 is bonded onto an insulating substrate 1. On the metal pattern 2, three switching elements 31, 32 and 33 are arranged along an X direction (a row direction). Also, three diode elements 51, 52 and 53 are arranged along an X direction so as to be placed in a Y direction (a column direction) relative to the switching elements, respectively. It is noted that the switching elements 31, 32, and 33 are IGBT semiconductor elements, for example.

A first main electrode (collector) is provided in one main surface of the switching element 31, and a second main electrode (emitter) is provided in the other main surface. Also, a gate electrode is provided in the same surface where the second main electrode is provided. The switching elements 32 and 33 have the same configuration as the switching element 31, and thus description thereof is omitted.

An anode electrode is provided in one main surface of the diode element 51, and a cathode electrode is provided in the other main surface. The diode elements 52 and 53 have the same configuration as the diode element 51, and thus description thereof is omitted.

The first main electrode (not shown) of the switching element 31 and the metal pattern 2 are bonded to each other by solder, for example. The gate electrode is electrically connected to the metal pattern 24 via a gate wire 9a. The second main electrode is electrically bonded to the anode electrode of the diode element 51 via a main-current wire 8a.

The cathode electrode (not shown) of the diode element 51 and the metal pattern 2 are bonded to each other by solder, for example. The anode electrode of the diode element 51 and the metal pattern 26 are electrically connected via a main-current wire 8c.

It is noted that a connection relation between the switching element 32 and the diode element 52 and a connection relation between the switching element 33 and the diode element 53 are the same as the above-described connection relation between the switching element 31 and the diode element 51, and thus description thereof is omitted.

In the above-described conventional IGBT module, three switching elements are laterally connected in parallel and three diode elements are laterally connected in parallel on the single insulating substrate 1, and eighteen switching elements and eighteen diode elements are connected in some parallel arrangements in the semiconductor module as a whole. In a case where a rated current of each element is 50 A, for example, the semiconductor module has a rated current of 900 A which is a sum of respective rated currents of eighteen elements each having a rated current of 50 A.

One among requests made to a semiconductor module is an increase in a capacitance of a rated current for the following reasons. In a case of a system which is required to have a rated current of 1800 A, for example, while two semiconductor modules should be connected in parallel for use if each semiconductor module being used is rated at 900 A, one semiconductor module is sufficient and parallel connection is unnecessary if each semiconductor module being used is rated at 1800 A.

In order to increase a rated current of one semiconductor module, it is required to increase the number of semiconductor elements which are to be connected in parallel. In the basic art, on the single insulating substrate 1, the three switching elements 31, 32 and 33 are arranged in parallel along an X direction, and the diode elements 51, 52 and 53 are arranged in series with the switching elements, respectively. By providing a configuration in which six switching elements are laterally arranged and also six diode elements are laterally arranged, it is possible to double a rated current. However, this would make a shape of each of the insulating substrate 1 and the semiconductor module 30 laterally long significantly, to cause inconvenience of a remarkably-shortened thermal life or the like, due to an increase in stress resulted from a temperature change during use of the semiconductor module 30, or the like. The following embodiments could obviate the foregoing inconvenience.

First Embodiment

FIG. 1 is a plan view of a semiconductor device 100 according to a first embodiment. The semiconductor device 100 according to the first embodiment is mounted onto the semiconductor module 30 (FIG. 14), in place of each of the semiconductor devices 10 and 10A shown in the basic art.

The semiconductor device 100 includes an insulating substrate 1, a metal pattern 2 which is a continuous piece, six switching elements 31, 32, 33, 41, 42, and 43, and three diode elements 51, 52, and 53. It is noted that each of the switching elements 31, 32, 33, 41, 42, and 43 is an IGBT, for example.

The insulating substrate 1 is made of SiN, AlN, or the like. The metal pattern 2 is made of copper, aluminum, or the like.

The metal pattern 2 is bonded onto the insulating substrate 1. The insulating substrate 1 is bonded onto a base plate not shown (which corresponds to the base plate 19 in the basic art). On a surface of the metal pattern 2, which is opposite to the insulating substrate 1, the switching elements 31, 32, 33, 41, 42, and 43, are arranged in a matrix of three columns along an X direction (row direction) and two rows along a Y direction (column direction). Each of the switching elements is bonded to the metal pattern 2 by solder, for example.

Also, on the metal pattern 2, the diode elements 51, 52, and 53 are arranged in one line along an X direction. Each of the diode elements is bonded to the metal pattern 2 by solder, for example. Also, a lower end of a collector main electrode 28 is bonded to the metal pattern 2 by solder, for example.

A first main electrode (collector) is provided in one main surface (a surface closer to the insulating substrate 1) of the switching element 31. The first main electrode is bonded to the metal pattern 2. A second main electrode 31a (emitter) is provided in the other main surface of the switching element 31. Also, a gate electrode 31b is provided in the same surface where the second main electrode 31a is provided. The gate electrode 31b is provided so as to abut on a corner of the other main surface of the switching element 31.

Likewise, a first main electrode, a second main electrode 32a, and a gate electrode 32b are provided in the switching element 32. A first main electrode, a second main electrode 33a, and a gate electrode 33b are provided in the switching element 33. A first main electrode, a second main electrode 41a, and a gate electrode 41b are provided in the switching element 41. A first main electrode, a second main electrode 42a, and a gate electrode 42b are provided in the switching element 42. A first main electrode, a second main electrode 43a, and a gate electrode 43b are provided in the switching element 43.

A cathode electrode is provided in one main surface (a surface closer to the insulating substrate 1) of the diode element 51. The cathode electrode is bonded to the metal pattern 2. An anode electrode 51a is provided in the other surface of the diode element 51. Likewise, a cathode electrode and an anode electrode 52a are provided in the diode element 52. A cathode electrode and an anode electrode 53a are provided in the diode element 53.

According to the present embodiment, along a Y direction (column direction), the respective main electrodes of adjacent elements are electrically connected via at least one wire (a main-current wire). More specifically, as shown in FIG. 1, the second main electrode 31a of the switching element 31 and the second main electrode 41a of the switching element 41 are electrically connected via two parallel main-current wires 8a. Also, the second main electrode 41a of the switching element 41 and the anode electrode 51a of the diode element 51 are electrically connected via two parallel main-current wires 8b. Also, the anode electrode 51a of the diode element 51 and the metal pattern 26 are electrically connected via two parallel main-current wires 8c.

The same connection relation provided by the main-current wires 8a, 8b, and 8c along a Y direction as described above is provided among the switching elements 32 and 42 and the diode element 52. Also, the same connection relation as described above is provided among the switching elements 33 and 43 and the diode element 53.

As shown in FIG. 1, the gate electrode 31b of the switching element 31 and the metal pattern 24 are electrically connected via a gate wire 9a. Also, the gate electrode 41b of the switching element 41 and the metal pattern 24 are electrically connected via a gate wire 9b. The same connection relation provided by the gate wires 9a and 9b as described above is provided between the switching elements 32 and 42 and between the switching elements 33 and 43.

Effects

The semiconductor device 100 according to the first embodiment includes the insulating substrate 1, the metal pattern 2 which is a continuous piece and is bonded to one main surface of the insulating substrate 1, and the plurality of switching elements 31, 32, 33, 41, 42, and 43 which are bonded to a surface opposite to the insulating substrate 1 on the metal pattern 2, and the plurality of switching elements are arranged in a matrix of two or more rows and two or more columns on the metal pattern 2.

The semiconductor device 100 (FIG. 1) according to the first embodiment is compared to the basic art (FIG. 14). The semiconductor device 100 according to the first embodiment has a configuration in which the number of switching elements is made larger by three than that in the semiconductor device 10 according to the basic art. According to the first embodiment, with respect to the semiconductor device 10 of the basic art, a switching element is additionally placed not along a longer side (along an X direction) of the insulating substrate 1, but along a shorter side (along a Y direction) of the insulating substrate 1. It is general that as the insulating substrate 1 becomes laterally longer, stress applied on an insulating substrate increases due to a temperature change during use of a module, which causes inconvenience of a remarkably-shortened thermal life, or the like. According to the first embodiment, a switching element is additionally placed along a widthwise direction of the insulating substrate 1, which can prevent the insulating substrate 1 from becoming laterally long significantly. Therefore, it is possible to increase the number of switching elements and obtain the semiconductor device 100 with a high rated current while preventing the insulating substrate 1 from becoming laterally long significantly.

Also, in the semiconductor device 100 according to the first embodiment, each of the plurality of switching elements 31, 32, 33, 41, 42, and 43 includes the first main electrode provided in one main surface which is bonded to the metal pattern 2, the second main electrode 31a, 32a, 33a, 41a, 42a, or 43a provided in the other main surface opposite to the one main surface, and at least one gate electrode 31b, 32b, 33b, 41b, 42b, or 43b provided in the other main surface, and respective second main electrodes of switching elements which are adjacently arranged along a row direction or a column direction are electrically connected via at least one main-current wire 8a or 8b.

According to the first embodiment, the respective second main electrode 31a and 41a of the switching elements arranged adjacently along a column direction (Y direction) (the switching elements 31 and 41, for example) are connected via the two parallel main-current wires 8a. To place a wire so as to connect respective main electrodes of switching elements arranged adjacently as described above could shorten a wiring length of a wire through which a main current shall flow.

Also, the semiconductor module according to the first embodiment includes a plurality of semiconductor devices 100 and the base plate 19 onto which the plurality of semiconductor devices 100 are mounted. Therefore, it is possible to increase the number of switching elements and obtain a semiconductor module with a high rated current while preventing a size of the semiconductor module from becoming laterally long significantly. It is noted that the semiconductor module may mount any of semiconductor devices described later in second to twelfth embodiments, in place of the semiconductor device 100.

Second Embodiment

Figure 2:
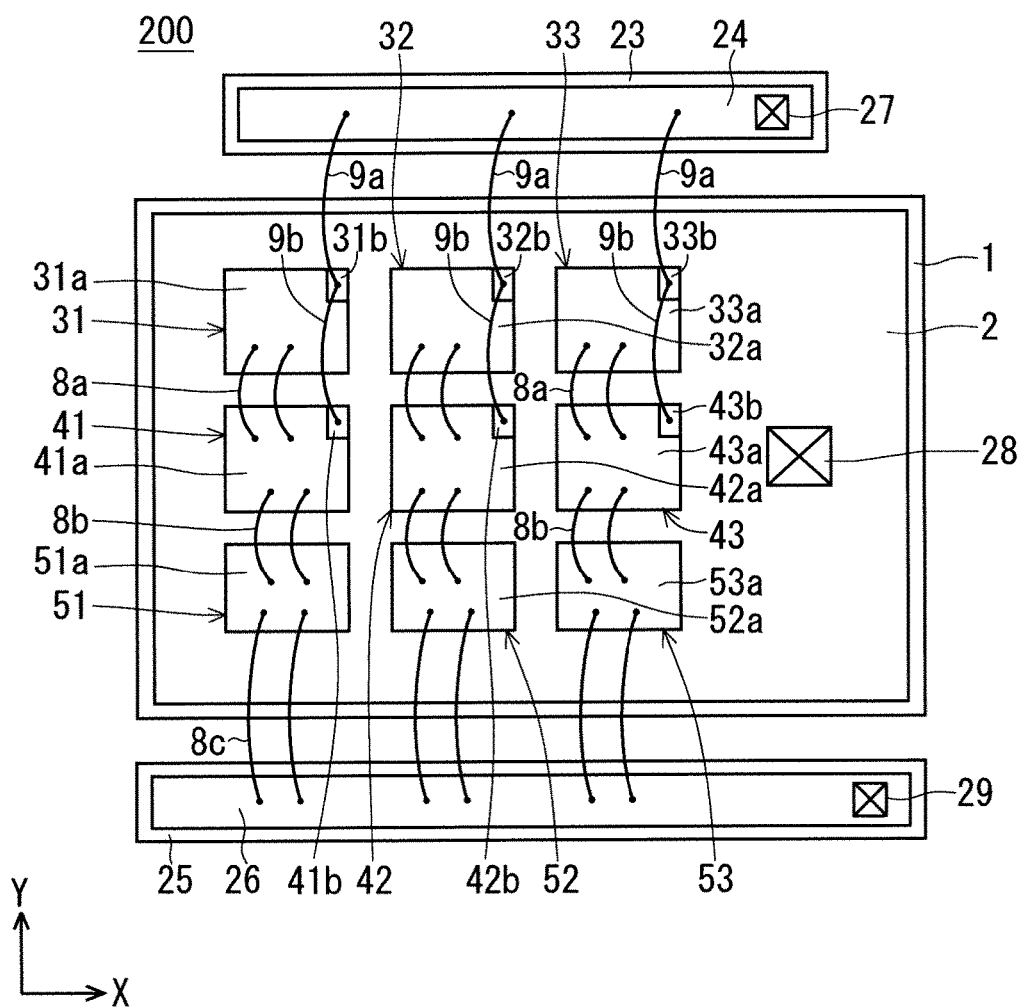
FIG. 2 is a plan view of a semiconductor device according to a second embodiment.

FIG. 2 is a plan view of a semiconductor device 200 according to a second embodiment. In the first embodiment (FIG. 1), the gate wires 9a and 9b are connected to each of the gate electrodes 31b, 32b, 33b, 41b, 42b, and 43b of the switching elements 31, 32, 33, 41, 42, and 43, from the metal pattern 24.

In the semiconductor device 200 according to the second embodiment, respective gate electrodes of switching elements which are arranged adjacently along a Y direction (column direction) are bonded by a gate wire. More specifically, as shown in FIG. 2, the gate electrodes 31b and 41b of the switching elements 31 and 41 which are arranged adjacently along a Y direction are bonded by the gate wire 9b. Likewise, the gate electrodes 32b and 42b of the switching elements 32 and 42 which are arranged adjacently along a Y direction are bonded by the gate wire 9b. Likewise, the gate electrodes 33b and 43b of the switching elements 33 and 43 which are arranged adjacently along a Y direction are bonded by the gate wire 9b. It is noted that the gate wire 9a and the gate wire 9b may be stitch-bonded continuously with each other as shown in FIG. 2, or alternatively, the gate wire 9a and the gate wire 9b may be separated from each other on each of the gate electrodes 31b, 32b, and 33b.

A configuration of the semiconductor device 200 is identical to that of the semiconductor device 100 (FIG. 1) according to the first embodiment in the other respects than described above, and thus description thereof is omitted.

Effects

In the semiconductor device 200 according to the second embodiment, along a row direction or a column direction, respective gate electrodes of switching elements arranged adjacently are bonded by a gate wire.

Accordingly, in the second embodiment, the number of gate wires bonded to the metal pattern 24 can be reduced. Also, a wiring length of a gate wire can be reduced. Because of reduction in the number of gate wires and reduction in a length of a gate wire, constraints on a direction of wiring or the like at a time of bonding a gate wire in wire-bonding can be eased. Also, because of reduction in the number of gate wires bonded to the metal pattern 24, an area of the metal pattern 24 can be reduced. As a result of this, an area of the insulating substrate 23 to which the metal pattern 24 is bonded can be reduced, which allows reduction in a cost for materials.

Third Embodiment

Figure 3:
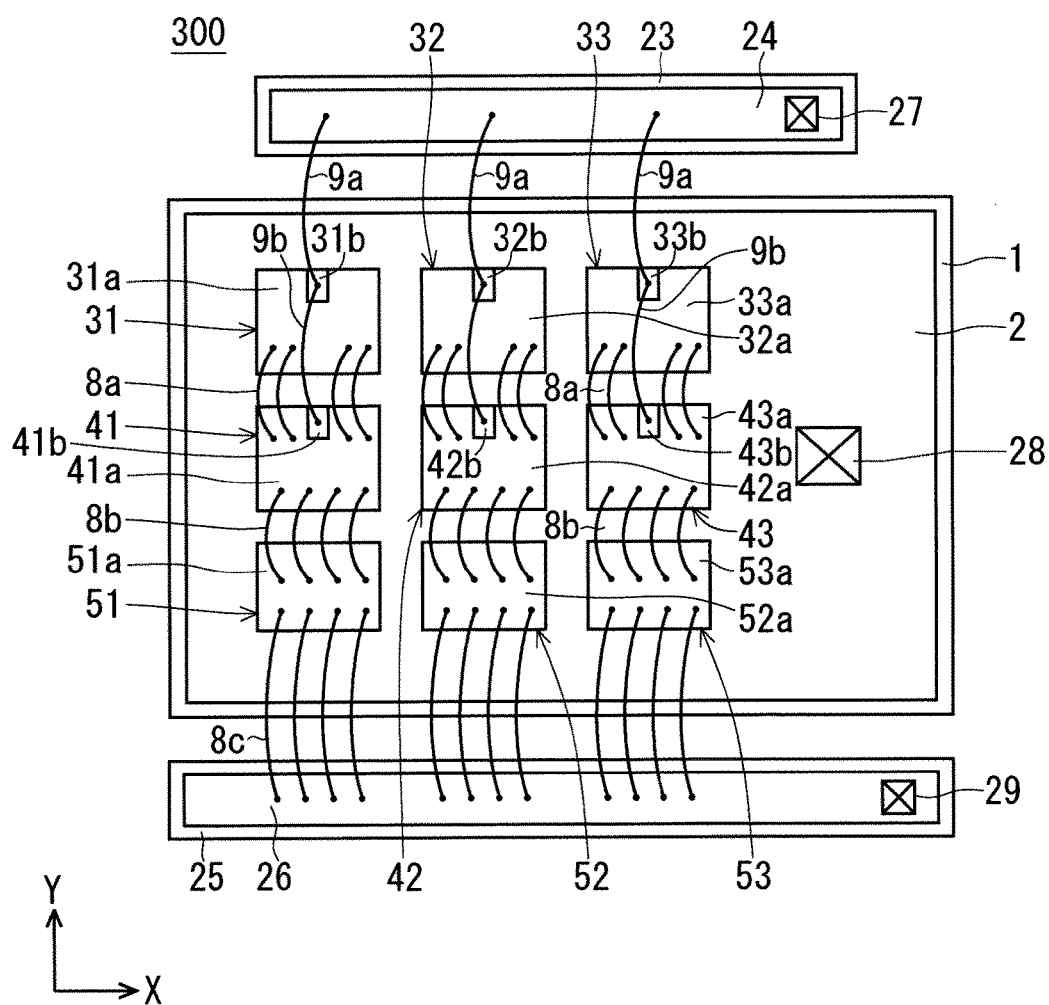
FIG. 3 is a plan view of a semiconductor device according to a third embodiment.

FIG. 3 is a plan view of a semiconductor device 300 according to a third embodiment. According to the third embodiment, the gate electrode 31b of the switching element 31 is provided at a substantially equal distance from two sides which are parallel to a direction along which the main-current wire 8a extends (Y direction). In other words, the gate electrode 31b is provided near a midway point between two sides orthogonal to an X direction. The gate electrodes 32b, 33b, 41b, 42b, and 43b of the other switching elements 32, 33, 41, 42, and 43 are positioned in the same manner as described above.

According to the third embodiment, the respective second main electrodes 31a and 41a of the switching elements 31 and 41 which are arranged adjacently along a Y direction (column direction) are connected by four parallel main-current wires 8a. More specifically, the four main-current wires 8a are arranged in such a manner that two of them are placed in a +X direction relative to the gate electrode 41b of the switching element 41 while the other two are placed in a −X direction relative to the gate electrode 41b of the switching element 41, and the two wires and the other two wires are symmetrical with respect to the gate electrode 41b.

Also, the second main electrode 41a of the switching element 41 and the anode electrode 51a of the diode element 51 which are arranged adjacently along a Y direction (column direction) are connected by four parallel main-current wires 8b. Also, the anode electrode 51a of the diode element 51 and the metal pattern 26 are connected by four parallel main-current wires 8c.

The same connection relation as described above and provided by the main-current wires 8a, 8b, and 8c along a Y direction is provided among the switching elements 32 and 42 and the diode element 52. Also, the same connection relation as described above is provided among the switching elements 33 and 43 and the diode element 53.

A configuration of the semiconductor device 300 is identical to that of the semiconductor device 200 (FIG. 2) according to the second embodiment in the other respects than described above, and thus description thereof is omitted.

Effects

In the semiconductor device 300 according to the third embodiment, a gate electrode (the gate electrode 31b, for example) is provided at an equal distance from two opposed sides of the other main surface, and the two opposed sides are parallel to one direction (that is, a column direction (Y direction)).

Therefore, according to the third embodiment, the same number of main-current wires 8a are placed and the same shape of main-current wires 8a are formed, in each of a left-hand side and a right-hand side of the gate wire 9b. As a result of this, influences upon the gate wire 9b, which are exerted by electromagnetic induction due to conduction of a main current and electromagnetic induction due to a change in current at a time of interruption, on a right-hand side of the gate wire 9b, and the same influences on a left-hand side of the gate wire 9b, cancel each other. Thus, it is possible to reduce a change in a supply voltage provided to a gate electrode of each of switching elements and variation in a switching speed. This makes it possible to obtain the semiconductor device 300 which prevents an element from being broken down due to reduction in tolerance for interruption and an increase in a short-circuit current, and obtain a semiconductor module including the semiconductor device 300.

Fourth Embodiment

Figure 4:
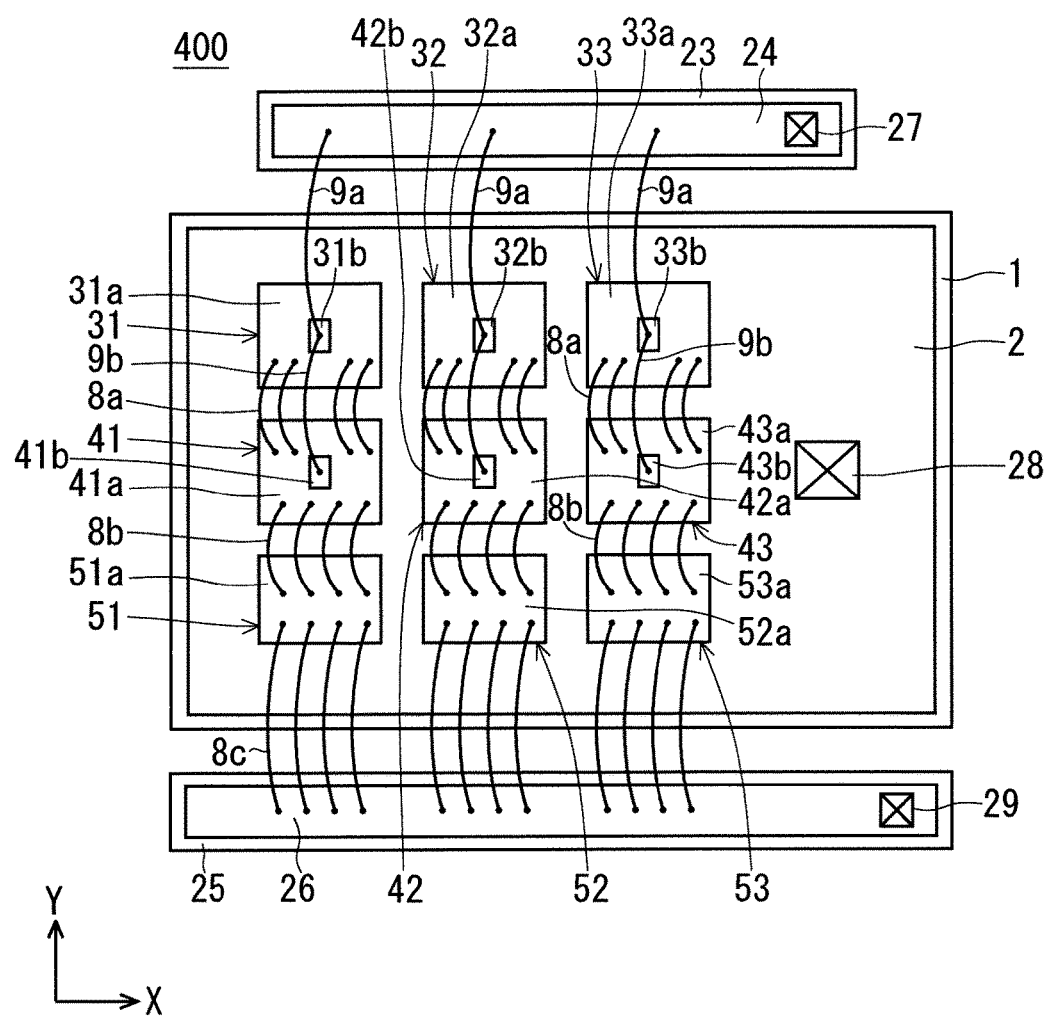
FIG. 4 is a plan view of a semiconductor device according to a fourth embodiment.

FIG. 4 is a plan view of a semiconductor device 400 according to a fourth embodiment. According to the fourth embodiment, the gate electrode 31b of the switching element 31 is provided in an almost center of the other main surface of the switching element 31. In other words, the gate electrode 31b is provided in a region which is a substantially central region of one side of the switching element 31, orthogonal to a direction of the main-current wires 8a and 8*b*, and also is a substantially central region of one side of an IGBT element, parallel to a direction of a main-current conduction wire.

The gate electrodes 32*b*, 33*b*, 41*b*, 42*b*, and 43*b* of the other switching elements 32, 33, 41, 42, and 43 are positioned in the same manner as described above.

A configuration of the semiconductor device 400 is identical to that of the semiconductor device 300 (FIG. 3) according to the third embodiment in the other respects than described above, and thus description thereof is omitted. Also in the fourth embodiment, the same effects as described in the third embodiment can be attained.

Fifth Embodiment

FIG. 5 is a plan view of a semiconductor device 500 according to a fifth embodiment. According to the fifth embodiment, two gate electrodes 31*b* are provided in the switching element 31. The two gate electrodes 31*b* are provided so as to abut on two opposed sides, respectively. In this regard, the two opposed sides are two sides extending along a direction (X direction) orthogonal to a direction along which the main-current wires 8*a* and 8*b* extend (Y direction). The gate electrodes 32*b*, 33*b*, 41*b*, 42*b*, and 43*b* of the other switching elements 32, 33, 41, 42, and 43 are configured in the same manner as described above.

According to the fifth embodiment, as shown in FIG. 5, the respective gate electrodes 31*b* and 41*b* of the switching elements 31 and 41 arranged adjacently along a Y direction (column direction) are opposed to each other. The opposed gate electrodes 31*b* and 41*b* are electrically connected via the gate wire 9*b*. The switching elements 32 and 42 and the switching elements 33 and 43 are configured in the same manner as described above.

According to the fifth embodiment, the respective second main electrodes 31*a* and 41*a* of the switching elements 31 and 41 arranged adjacently along a Y direction (column direction) are connected by two parallel main-current wires 8*a*. More specifically, the two main-current wires 8*a* are arranged in such a manner that one of them is placed in a +X direction relative to the gate electrode 31*b* and the gate electrode 41*b* while the other is placed in a −X direction relative to the gate electrode 31*b* and the gate electrode 41*b*, and the two wires are symmetrical with respect to the gate electrode 31*b* and the gate electrode 41*b*.

Effects

In the semiconductor device 500 according to the fifth embodiment, two gate electrodes are provided in each of switching elements, the gate electrodes are provided so as to abut on two opposed sides of the other main surface, respectively, and along one direction of a row direction and a column direction, a plurality of switching elements are arranged such that respective gate electrodes of switching elements which are arranged adjacently are opposed to each other.

Therefore, according to the fifth embodiment, the respective gate electrodes 31*b* and 41*b* of switching elements arranged adjacently (switching elements 31 and 41, for example) are opposed to each other, so that a length of the gate wire 9*b* which connects the gate electrodes 31*b* and 41*b* can be shortened.

Sixth Embodiment

Figure 6:
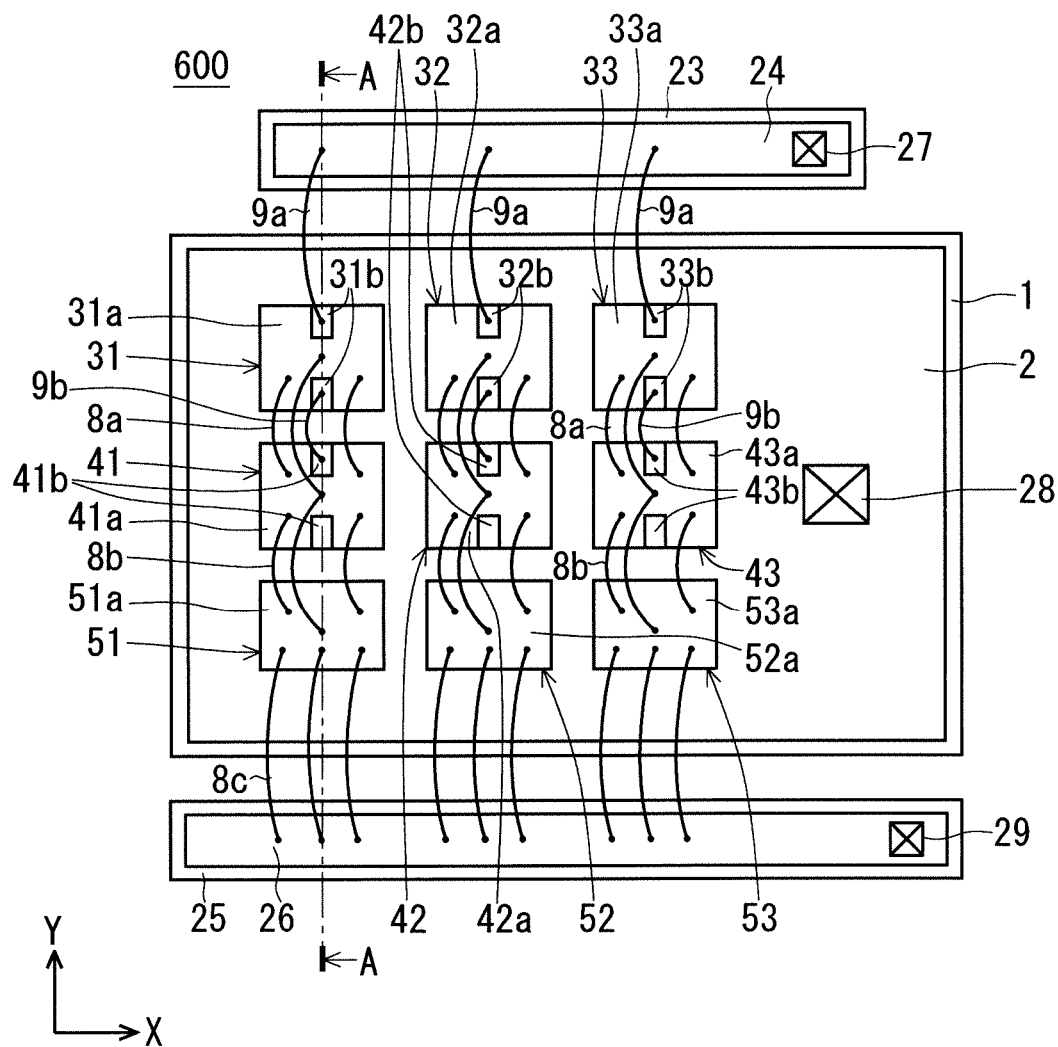
FIG. 6 is a plan view of a semiconductor device according to a sixth embodiment.

FIG. 6 is a plan view of a semiconductor device 600 according to a sixth embodiment. Also, FIG. 7 is a cross-sectional view of the semiconductor device 600, taken along a line A-A in FIG. 6.

As shown in FIG. 6, in the semiconductor device 600, in addition to the configuration of the semiconductor device 500 (FIG. 5), the second main electrode 31*a* between the two gate electrodes 31*b* of the switching element 31 and the second main electrodes 41*a* between the two gate electrodes 41*b* of the switching element 41 are connected by the main-current wire 8*a*. Also, the second main electrode 41*a* between the two gate electrodes 41*b* of the switching element 41 and the anode electrode 51*a* of the diode element 51 are connected by the main-current wire 8*b*. The switching elements 32 and 42 and the diode element 52, as well as the switching elements 33 and 43 and the diode element 53, are configured in the same manner as described above.

Figure 7:
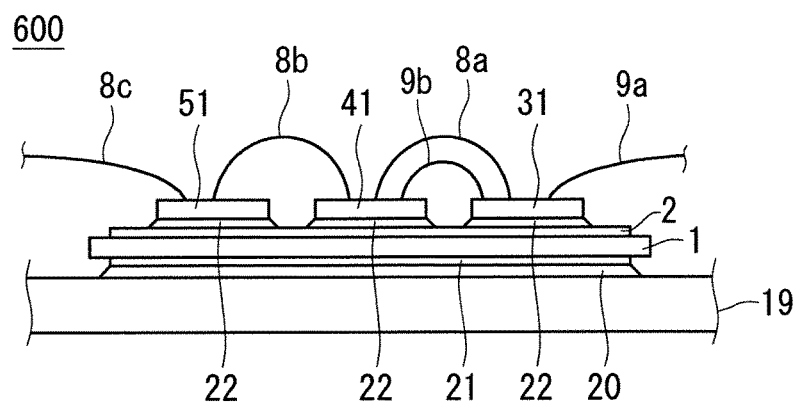
FIG. 7 is a cross-sectional view of the semiconductor device according to the sixth embodiment.

As shown in FIG. 7, a backside metal pattern 21 of the insulating substrate 1 is connected onto the base plate 19 by solder 20, and the switching elements 31 and 41 and the diode element 51 are bonded onto the metal pattern 2 on a front side by solder 22. As shown in FIG. 7, a height of the main-current wire 8*a* is greater than a height of the gate wire 9*b*. This can prevent the gate wire 9*b* and the main-current wire 8*a* from interfering with each other even when the wires are placed so as to overlap each other in plan view.

A configuration of the semiconductor device 600 is identical to that of the semiconductor device 500 (FIG. 5) according to the fifth embodiment in the other respects than described above, and thus description thereof is omitted.

Effects

In the semiconductor device 600 according to the sixth embodiment, a second main electrode is placed between two gate electrodes in the other main surface, and the main-current wires 8*a* and 8*b* are connected to the second main electrodes.

To adopt the configuration according to the sixth embodiment allows an increase in the number of the main-current wires 8*a* and 8*b*, so that a current density per wire can be decreased. Accordingly, a thermal life of a wire can be prevented from being shortened due to an increase in generated heat.

In the semiconductor device 600 according to the sixth embodiment, a height of the main-current wire 8*a* is greater than a height of the gate wire 9*b*.

Accordingly, even when the gate wire 9*b* and the main-current wire 8*a* are placed so as to overlap each other in plan view, the wires do not interfere with each other. Hence, more main-current wires 8*a* can be placed.

Seventh Embodiment

Figure 8:
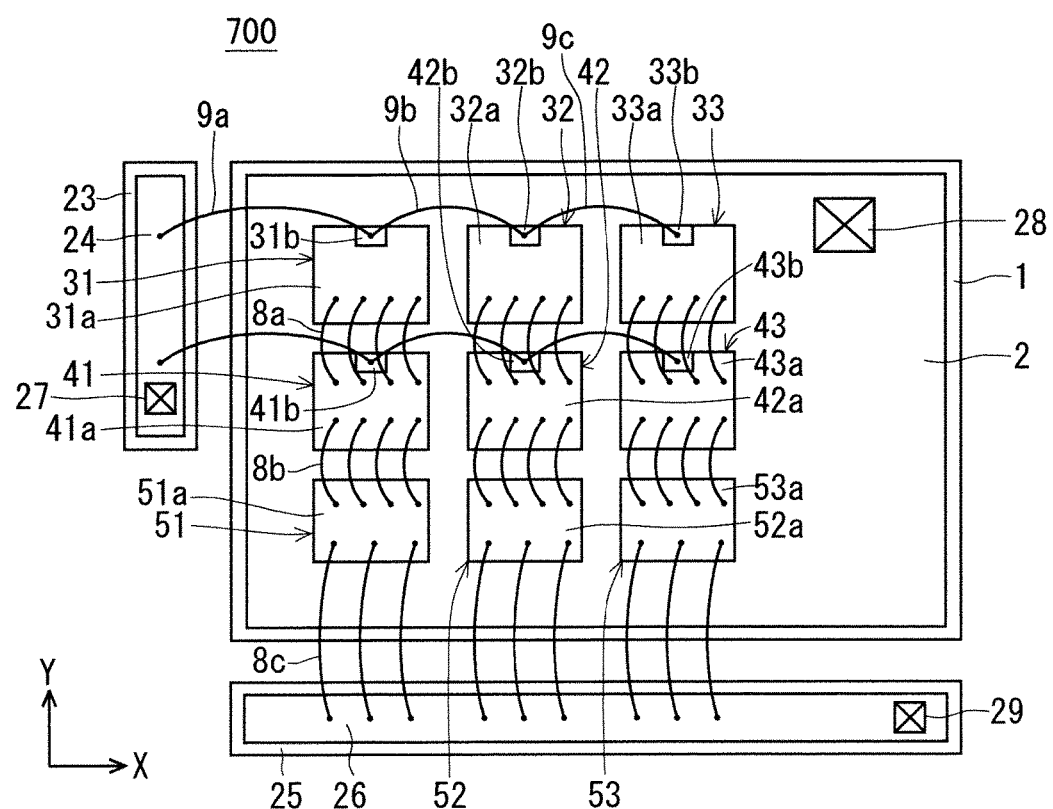
FIG. 8 is a plan view of a semiconductor device according to a seventh embodiment.

FIG. 8 is a plan view of a semiconductor device 700 according to a seventh embodiment. In the seventh embodiment, the switching elements 31, 32, 33, 41, 42, and 43 and the diode elements 51, 52, and 53 which are bonded onto the metal pattern 2 are arranged in the same manner as in the first to sixth embodiments. According to the seventh embodiment, a direction along which the gate wires 9*a*, 9*b*, and 9*c* for connecting gate electrodes of switching elements extend and a direction along which the main-current wires 8*a*, 8*b*, and 8*c* for connecting second main electrodes of switching elements extend are orthogonal to each other.

More specifically, as shown in FIG. 8, along a Y direction (column direction), the second main electrode 31*a* of the switching element 31 and the second main electrode 41*a* of the switching element 41 are electrically connected via four parallel main-current wires 8*a*. Also, the second main electrode 41*a* of the switching element 41 and the anode electrode 51a of the diode element 51 are electrically connected via four parallel main-current wires 8b. Further, the anode electrode 51a of the diode element 51 and the metal pattern 26 are electrically connected via three parallel main-current wires 8c.

The same connection relation as described above and provided by the main-current wires 8a, 8b, and 8c along a Y direction is provided among the switching elements 32 and 42 and the diode element 52. Also, the same connection relation as described above is provided among the switching elements 33 and 43 and the diode element 53.

As shown in FIG. 8, along an X direction (row direction), the gate electrode 31b of the switching element 31 and the metal pattern 24 are electrically via the gate wire 9a. In this regard, the metal pattern 24 is placed in a −X direction relative to the insulating substrate 1. Also, the gate electrode 31b of the switching element 31 and the gate electrode 32b of the switching element 32 are electrically connected via the gate wire 9b. Also, the gate electrode 32b of the switching element 32 and the gate electrode 33b of the switching element 33 are electrically connected via the gate wire 9c.

The same connection relation as described above and provided by the gate wires 9a, 9c, and 9c along an X direction is provided among the switching elements 41, 42, and 43.

As shown in FIG. 8, according to the seventh embodiment, the gate wires 9a, 9b, and 9c and the main-current wire 8a cross each other by a grade-separation method. Such crossing can be achieved by a height of the main-current wire 8a which is made greater than a height of each of the gate wires 9a, 9b, and 9c.

Also, according to the seventh embodiment, as shown in FIG. 8, the gate electrode 31b of the switching element 31 has a shape of a rectangle in plan view. A longer side of the gate electrode 31b abuts on one side of the other main surface of the switching element 31, which is parallel to an X direction (that is, a direction along which the gate wires 9a, 9b, and 9c are connected). The gate electrodes 32b, 33b, 41b, 42b, and 43b of the other switching elements 32, 33, 41, 42, and 43 are configured in the same manner as described above.

To adopt the above-described configuration for a gate electrode allows reduction in an invalid area of a gate electrode (an area where a gate wire cannot be bonded). That is, an area of a second main electrode can be increased. Further, also an invalid area of each of the main-current wires 8a, 8b, and 8c (that is, an area where a main-current wire cannot be bonded) can be reduced. Thus, the number of main-current wires which can be bonded to one second main electrode can be increased.

It is noted that whereas each of the first to sixth embodiments has described an example in which respective gate electrodes of two adjacent switching elements are connected by a gate wire, respective gate electrodes of three or more switching elements which are continuously adjacent may be connected in the same manner as in the seventh embodiment.

Also, it is noted that though the metal pattern 26 is placed in a −Y direction relative to the insulating substrate 1 in FIG. 8, the metal pattern 26 may be placed in a +Y direction relative to the insulating substrate 1. In this case, the second main electrodes 31a, 32a, and 33a of the switching elements 31, 32, and 33 are connected to the metal pattern 26 by a main-current wire.

Effects

In the semiconductor device 700 according to the seventh embodiment, respective gate electrodes of switching elements arranged adjacently along one direction of a row direction and a column direction are bonded by a gate wire, and respective second main electrodes of switching elements arranged adjacently along the other direction of a row direction and a column direction are bonded by a main-current wire.

According to the seventh embodiment, a direction along which the gate wires 9a, 9b, and 9c are connected (row direction) and a direction along which the main-current wires 8a, 8b, and 8c are connected (column direction) are orthogonal to each other. This reduces influences of electromagnetic induction due to conduction of a main current and electromagnetic induction due to a change in a current at a time of interruption.

Accordingly, a change in a supply voltage provided to a gate electrode of each of switching elements and variation in a switching speed can be reduced. Therefore, it is possible to obtain the semiconductor device 700 which prevents an element from being broken down due to reduction in a tolerance for interruption and an increase in a short-circuit current, and obtain a semiconductor module including the foregoing semiconductor device.

Also, in the semiconductor device 700 according to the seventh embodiment, a gate electrode of each of switching elements has a shape of a rectangle in plan view, and a longer side of a gate electrode abuts on one side of the other main surface of a switching element.

Accordingly, by bringing a direction along which a longer side of a gate electrode extends (X direction) and a direction along which the gate wires 9a, 9b, and 9c are connected (row direction) in agreement with each other, it is possible to reduce an invalid area of a gate electrode (an area where a gate wire cannot be bonded). That is, an area of a second main electrode can be increased. Further, also an invalid area of the main-current wires 8a, 8b, and 8c (an area where a main-current wire cannot be bonded) can be reduced. Thus, the number of main-current wires which can be bonded to one second main electrode can be increased.

Also, in the semiconductor device 700 according to the seventh embodiment, the gate wires 9a, 9b, and 9c and the main-current wire 8a cross each other by a grade-separation method.

Thus, by making a height of the main-current wire 8a greater than a height of each of the gate wires 9a, 9b, and 9c, it is possible to achieve a configuration in which the gate wires 9a, 9b, and 9c and the main-current wire 8a cross each other by a grade-separation method.

Eighth Embodiment

Figure 9:
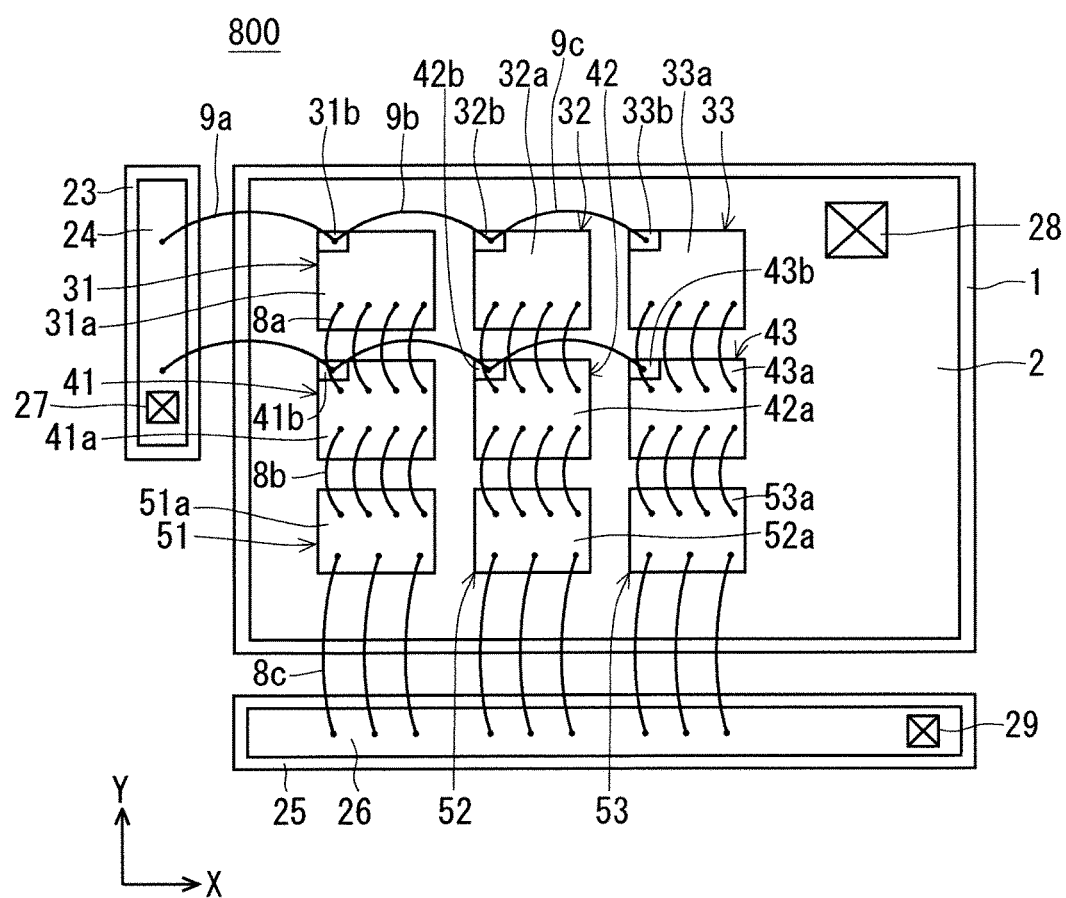
FIG. 9 is a plan view of a semiconductor device according to an eighth embodiment.

FIG. 9 is a plan view of a semiconductor device 800 according to an eighth embodiment. According to the eighth embodiment, the gate electrode 31b of the switching element 31 is provided so as to abut on a side placed in a −X direction. The gate electrodes 32b, 33b, 41b, 42b, and 43b of the other switching elements 32, 33, 41, 42, and 43 are configured in the same manner as described above.

Accordingly, a length of the gate wire 9a for connecting the gate electrode 31b of the switching element 31 and the metal pattern 24 can be shortened. That is, a cumulative length of the gate wires 9a, 9b, and 9c, which is measured from the metal pattern 24 to each of the gate electrodes 33b and 43b which are placed farthest from the metal pattern 24 can be shortened. Hence, an amount of usage of a gate wire is reduced, so that a cost for materials of a gate wire can be reduced.

It is noted that a configuration of the semiconductor device 800 is identical to that of the semiconductor device 700 (FIG. 8) according to the seventh embodiment in the other respects than described above, and thus description thereof is omitted.

Ninth Embodiment

FIG. 10 is a plan view of a semiconductor device 900 according to a ninth embodiment. According to the first to eighth embodiments, the switching elements 31, 32, 33, 41, 42, and 43 are arranged in a 3×2 matrix, and further, the diode elements 51, 52, and 53 are arranged along a column direction so as to form a 3×1 matrix. On the other hand, according to the ninth embodiment, as shown in FIG. 10, the switching elements 31, 32, 33, 41, 42, and 43 are arranged in a 2×3 matrix, and the diode elements 51, 52, and 53 are arranged along a row direction so as to form a 1×3 matrix.

As shown in FIG. 10, along a Y direction (column direction), the second main electrode 33a of the switching element 33 and the second main electrode 32a of the switching element 32 are electrically connected via four parallel main-current wires 8a. Also, the second main electrode 32a of the switching element 32 and the second main electrode 31a of the switching element 31 are electrically connected via four parallel main-current wires 8b. Also, the second main electrode 31a of the switching element 31 and the metal pattern 26 are electrically connected via three parallel main-current wires 8c.

The same connection relation as described above and provided by the main-current wires 8a, 8b, and 8c along a Y direction is provided by the switching elements 41, 42, and 43.

Also, along a Y direction (column) direction, the anode electrode 53a of the diode element 53 and the anode electrode 52a of the diode element 52 are electrically connected via four parallel main-current wires 8a. Also, the anode electrode 52a of the diode element 52 and the anode electrode 51a of the diode element 51 are electrically connected via four parallel main-current wires 8b. Also, the anode electrode 51a of the diode element 51 and the metal pattern 26 are electrically connected via three parallel main-current wires 8c.

As shown in FIG. 10, along an X direction (row direction), the gate electrode 33b of the switching element 33 and the metal pattern 24 are electrically connected via the gate wire 9a. In this regard, the metal pattern 24 is placed in a −X direction relative to the insulating substrate 1. Also, the gate electrode 33b of the switching element 33 and the gate electrode 43b of the switching element 43 are electrically connected via the gate wire 9b.

The same connection relation as described above and provided by the gate wires 9a and 9b along an X direction is provided between the switching elements 32 and 42 and between the switching elements 31 and 41.

Features of the ninth embodiment lie in inclusion of three stages in each of which respective gate electrodes of two adjacent switching elements are continuously wired. In the first to eighth embodiments, the metal pattern 24 is wired to each of the gate electrodes 33b and 43b which are placed farthest from the metal pattern 24, via three gate wires 9a, 9b, and 9c. On the other hand, according to the ninth embodiment, the metal pattern 24 is wired to each of the gate electrodes 41b, 42b, and 43b which are placed farthest from the metal pattern 24, via two gate wires 9a and 9b. Accordingly, a cumulative length of gate wires, which is measured from the metal pattern 24 to the farthest gate electrode is shortened, so that the semiconductor device 900 in which a detriment such as a delay in a gate switching time is not likely to occur can be obtained.

Tenth Embodiment

Figure 11:
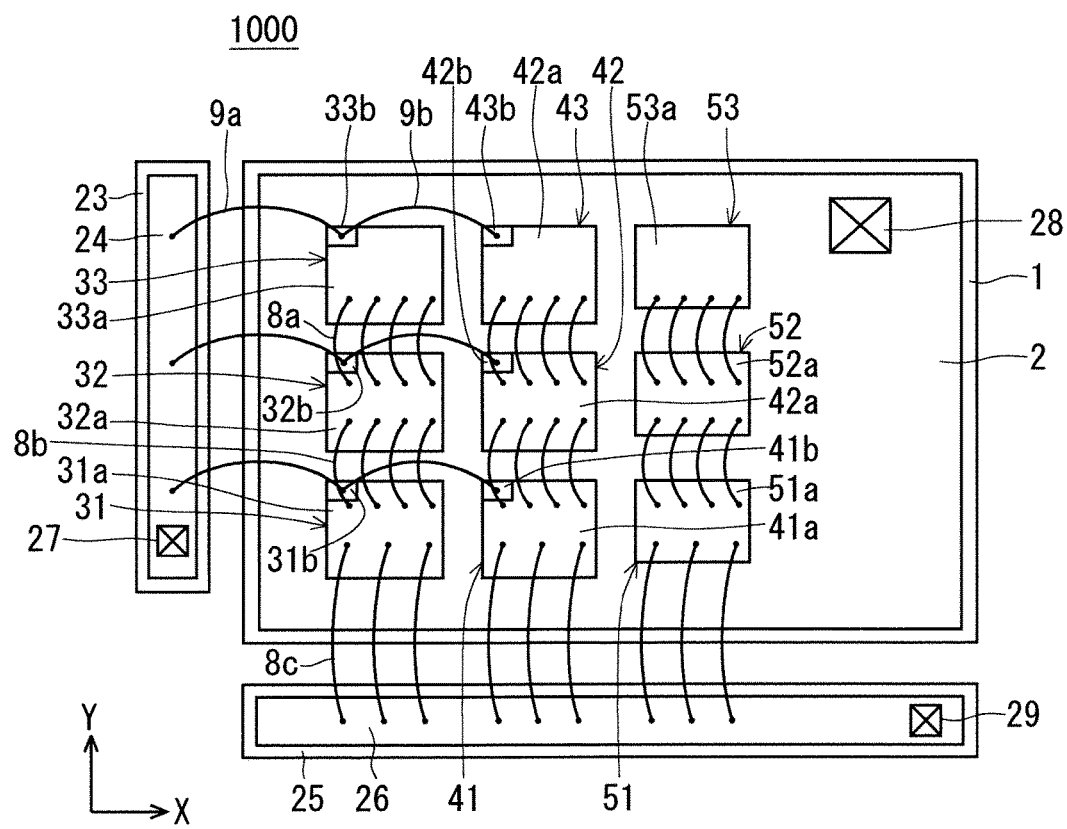
FIG. 11 is a plan view of a semiconductor device according to a tenth embodiment.

FIG. 11 is a plan view of a semiconductor device 1000 according to a tenth embodiment. According to the tenth embodiment, the switching elements 31, 32, 33, 41, 42, and 43 and the diode elements 51, 52, and 53 are arranged in the same manner as in the ninth embodiment (FIG. 10). Also, according to the tenth embodiment, the gate electrodes 31b, 32b, 33b, 41b, 42b, and 43b of the switching elements 31, 32, 33, 41, 42, and 43 are positioned in the same manner as in the eighth embodiment (FIG. 9). A configuration is identical to that of the eighth embodiment or the ninth embodiment in the other respects than described above, and thus description thereof is omitted.

According to the tenth embodiment, both of the same effects as described in the eighth embodiment and the same effects as described in the ninth embodiment can be attained.

Eleventh Embodiment

Figure 12:
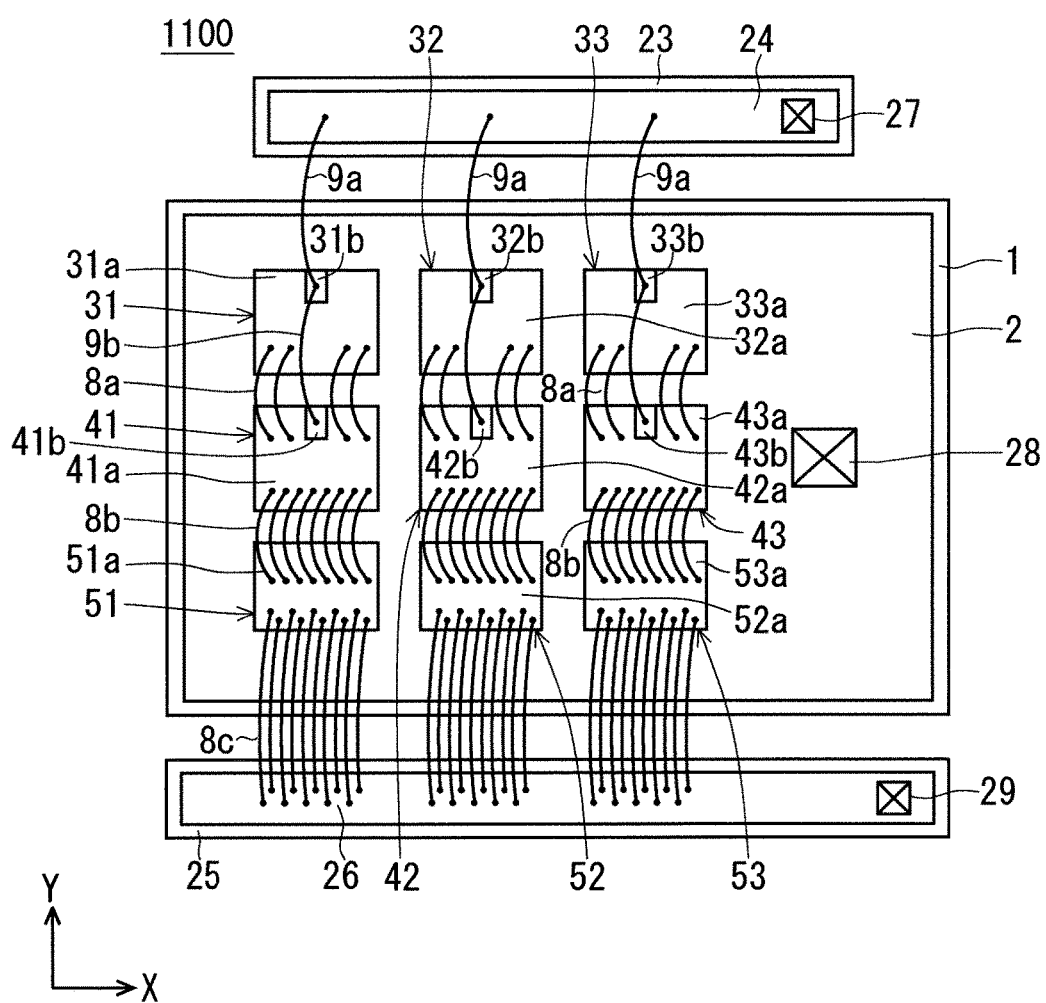
FIG. 12 is a plan view of a semiconductor device according to an eleventh embodiment.

FIG. 12 is a plan view of a semiconductor device 1100 according to an eleventh embodiment. According to the eleventh embodiment, the switching elements 31, 32, 33, 41, 42, and 43 and the diode elements 51, 52, and 53 are arranged in the same manner as in the third embodiment (FIG. 3).

According to the eleventh embodiment, the respective second main electrodes 31a and 41a of the switching elements 31 and 41 arranged adjacently along a Y direction (column direction) are connected via four parallel main-current wires 8a. More specifically, the four main-current wires 8a are arranged in such a manner that two of them are placed in a +X direction relative to the gate electrode 41b of the switching element 41 while the other two are placed in a −X direction relative to the gate electrode 41b of the switching element 41, and the two wires and the other two wires are symmetrical with respect to the gate electrode 41b.

Also, the second main electrode 41a of the switching element 41 and the anode electrode 51a of the diode element 51 which are arranged adjacently along a Y direction (column direction) are connected via eight parallel main-current wires 8b. Also, the anode electrode 51a of the diode element 51 and the metal pattern 26 are connected via ten parallel main-current wires 8c.

The same connection relation as described above and provided by the main-current wires 8a, 8b, and 8c along a Y direction is provided among the switching elements 32 and 42 and the diode elements 52. Also, the same connection relation as described above is provided among the switching elements 33 and 43 and the diode element 53.

A configuration of the semiconductor device 1100 is identical to that of the semiconductor device 300 (FIG. 3) according to the third embodiment in the other respects than described above, and thus description thereof is omitted.

According to the eleventh embodiment, as described above, the number of main-current wires for bonding respective second main electrodes of switching elements arranged adjacently increases along with advancement in a Y direction (column direction).

While the main-current wires 8a convey an emitter current for only the switching element 31, 32, or 33, the main-current wires 8b convey an emitter current for two elements of the switching element 31, 32, or 33 and the switching element 41, 42, or 43. The main-current wires 8c further convey not only an emitter current for the switching elements 31, 32, 33, 41, 42, and 43, but also an anode current for the diode elements 51, 52, and 53. According to the eleventh embodiment, main-current wires through which larger main currents flow are placed more greatly in numbers.

Effects

In the semiconductor device 1100 according to the eleventh embodiment, the number of main-current wires for bonding respective second main electrodes of switching elements arranged adjacently increases along with advancement in a row direction or a column direction.

In the semiconductor device 1100 according to the eleventh embodiment, a main current flowing through a main-current wire increases along with advancement in a Y direction (column direction). Accordingly, by making the number of the main-current wires 8b larger than the number of main-current wires 8a and making the number of the main-current wires 8c larger than the number of main-current wires 8b, it is possible to make respective current densities of all of the main-current wires 8a, 8b, and 8c substantially identical to each other. Thus, a thermal life of a main-current wire can be prevented from being shortened due to an increase in generated heat.

Twelfth Embodiment

Figure 13:
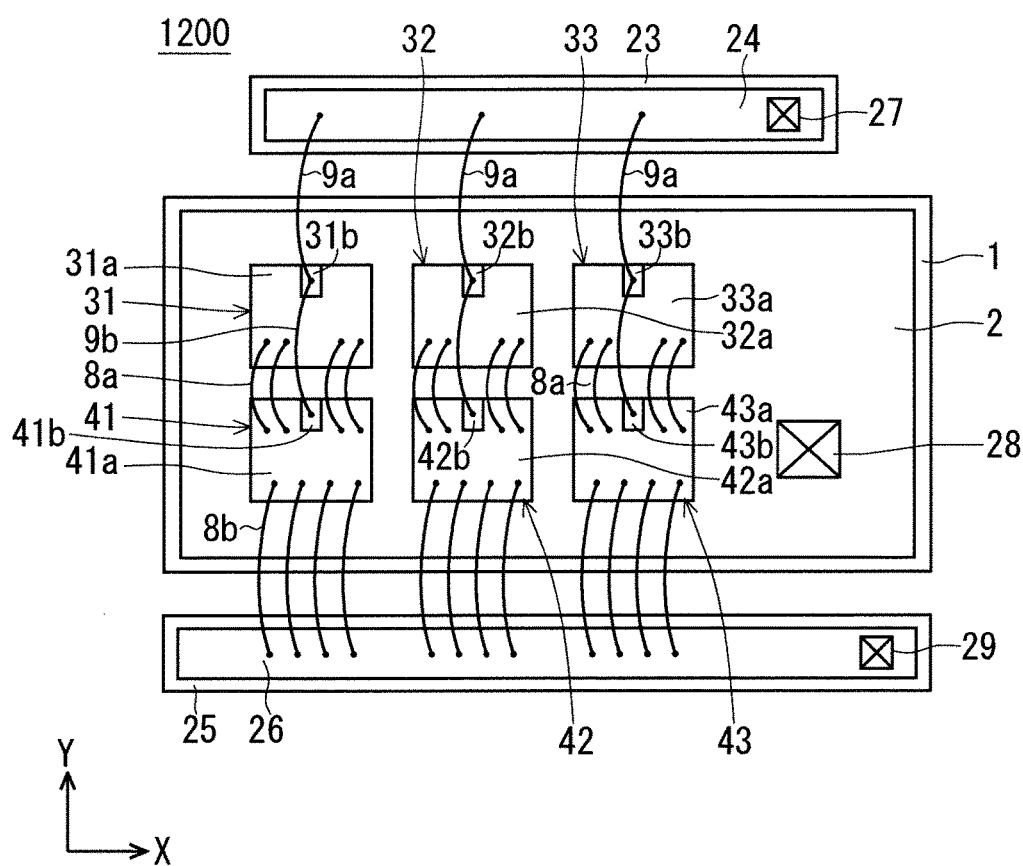
FIG. 13 is a plan view of a semiconductor device according to a twelfth embodiment.

FIG. 13 is a plan view of a semiconductor device 1200 according to a twelfth embodiment. According to the twelfth embodiment, unlike the first to eleventh embodiments, only the switching elements 31, 32, 33, 41, 42, and 43 are arranged in a 3×2 matrix on the metal pattern 2. It is noted that each of the switching elements is an IGBT having a reverse conducting function, for example. An IGBT having a reverse conducting function is an element in which a freewheeling diode is incorporated in an IGBT chip. Also, in a case where each of switching elements is a MOSFET, a parasitic diode (body diode) is incorporated between a source and a drain of the MOSFET.

A connection relation provided by the gate wires 9a and 9b and the main-current wire 8a according to the twelfth embodiment is the same as in the third embodiment (FIG. 3). The semiconductor device 1200 according to the twelfth embodiment does not include the diode elements 51, 52, and 53. Hence, the second main electrode 41a of the switching element 41 is not connected to the anode electrode 51a of the diode element 51, but is connected to the metal pattern 26 via the main-current wire 8b. The switching elements 42 and 43 are connected in the same manner as described above.

Effects

In the semiconductor device 1200 according to the twelfth embodiment, only the switching elements 31, 32, 33, 41, 42, and 43 are semiconductor elements arranged on the metal pattern 2, and a diode is incorporated in each of the switching elements 31, 32, 33, 41, 42, and 43.

Thus, the semiconductor device 1200 according to the twelfth embodiment does not include a diode element, so that a length of a main-current wire can be shortened. Accordingly, resistance of a main-current wire as a whole is reduced, so that a thermal life of a main-current wire can be prevented from being shortened due to an increase in generated heat.

It is noted that in the first to twelfth embodiments, a diameter of each of the gate wires 9a and 9b may be smaller than a diameter of each of the main-current wires 8a, 8b, and 8c. In the first to twelfth embodiments, a material, the number, and a shape of each of wires connecting electrodes, particularly the main-current wires 8a, 8b, and 8c, are not limited to those shown in the drawings and described above. Each of the main-current wires 8a, 8b, and 8c may be made of the other material than aluminum, and may be a copper wire, for example. Also, regarding a shape of a wire, each of wires may be a ribbon-like wire having a shape of a long and narrow plate, or a wire having a shape of a flat plate. Further, for the gate wires 9a and 9b thorough which a large current is not supposed to flow, by employing a wire having a diameter which is smaller than that of each of the main-current wires 8a, 8b, and 8c, it is possible to more easily avoid interference between wires.

It is noted that in the first to twelfth embodiments, regarding switching elements, for which cumulative lengths of gate wires reaching gate electrodes are identical to each other, respective electrical characteristics thereof which affect switching speeds may be set such that the switching speeds are identical to each other. For example, in FIG. 1, regarding the switching elements 31, 32, and 33, respective lengths of wires extending from the metal pattern 24 to the gate electrodes 41b, 42b, and 43b are identical to each other. Likewise, regarding the switching elements 41, 42, and 43, respective lengths of wires extending from the metal pattern 24 to the gate electrodes 31b, 32b, and 33b are identical to each other. In this case, regarding the switching elements 31, 32, and 33, respective characteristics of gate threshold voltages or saturation voltages between main electrodes are set so as to be identical to each other. Likewise, regarding the switching elements 41, 42, and 43, respective characteristics of gate threshold voltages or saturation voltages between main electrodes are set so as to be identical to each other. Also, the diode elements 51, 52, and 53 are designed such that respective forward drop voltages thereof are identical to each other.

Accordingly, in switching elements, for which cumulative lengths of the gate wires 9a and 9b reaching gate electrodes are identical to each other, even if resistance and inductance of each of the gate wires 9a and 9b and resistance and inductance of each of the main-current wires 8a and 8b are high, respective electrical characteristics which affect switching speeds of the switching elements are made identical to each other, so that variation in timing for switching in a plurality of switching elements can be reduced. Thus, the semiconductor device 100 in which reduction in tolerance for breakdown is reduced can be obtained.

Also, in switching elements, for which cumulative lengths of the gate wires 9a and 9b reaching gate electrodes are identical to each other, respective characteristics of gate threshold voltages or saturation voltages between main electrodes are made identical to each other, so that variation in timing for switching can be reduced. Further, by making electrical characteristics (saturation voltage, gate threshold voltage) of switching elements, for which cumulative lengths of main-current wires are great (switching elements 31, 32, and 33 in FIG. 1), lower than electrical characteristics of switching elements, for which cumulative lengths of main-current wires are small (switching elements 41, 42, and 43 in FIG. 1), it is possible to further reduce variation in timing for switching in a semiconductor device as a whole.

It is noted that though a plurality of switching elements are arranged in a 3×2 (or 2×3) matrix in the first to twelfth embodiments, the number and arrangement of switching elements are not limited to those described above so long as each of the number of rows and the number of columns is equal to or more than two.

Also, in each of the semiconductor devices according to the first to eleventh embodiments, the same number of diode elements 51, 52, and 53 as the number of rows or columns in a matrix are included, and a sum of areas of the other main surfaces of the plurality of switching elements 31, 32, 33, 41, 42, and 43 is larger than a sum of areas of upper surfaces of the plurality of diode elements 51, 52, and 53.

Thus, by making a current density of a diode element higher than a current density of a switching element, it is possible to make the number of diode elements smaller than the number of switching elements. In other words, a sum of areas of the other main surfaces of a plurality of switching elements can be made larger than a sum of areas of upper surfaces of a plurality of diode elements.

It is noted that in the first to twelfth embodiments, each of the switching elements 31, 32, 33, 41, 42, and 43 may include a wide-band-gap semiconductor.

Also, in the first to eleventh embodiments, each of the diode elements 51, 52, and 53 may include a wire-band-gap semiconductor.

Generally speaking, while a semiconductor element made of a wide-band-gap semiconductor such as SiC or GaN is more suitable for an increase in a breakdown voltage or usage under high-temperature circumstances than a silicon-made semiconductor element, fraction defective thereof during manufacture is higher than that of a silicon-made semiconductor element, and fraction defective thereof exponentially increases as an area of an element becomes larger. Thus, with the configurations according to the first to twelfth embodiments, by mounting many semiconductor elements each having a small area, it is possible to obtain a semiconductor device having low fraction defective. Accordingly, in a case where each of the switching elements 31, 32, 33, 41, 42, and 43 is made of a wide-band-gap semiconductor material, the first to twelfth embodiments are particularly effective. Also, a switching element made of a wide-band-gap semiconductor material can perform a switching operation at a high speed. That is, the first to twelfth embodiments in which reduction in tolerance for interruption due to variation in a switching speed, and a rise in a temperature of a main-current conducting wire due to variation in a main-current-carrying time, can be reduced, are particularly effective for a case where the switching elements 31, 32, 33, 41, 42, and 43 are made of a wide-band-gap semiconductor material, and so, a semiconductor device with improved reliability and an improved life can be obtained.

It is noted that an arrangement in which the insulating substrate 1 of the semiconductor device according to each of the embodiments is inverted in an X or Y direction, or is rotated 90 degrees, may be employed alternatively, depending on a positional relation between the metal patterns 24 and 26 and the insulating substrate 1.

Also, the above description of each of the embodiments has dealt with a case in which the metal pattern 2 which is a continuous piece on which the switching elements 31, 32, 33, 41, 42, and 43 are arranged in a matrix has a shape of a simple rectangle. However, a shape of the metal pattern 2 is not limited to that. That is, so long as a portion of the metal pattern 2 where the switching elements 31, 32, 33, 41, 42, and 43 are arranged in a matrix, is a continuous piece, a shape of the other portion of the metal pattern 2 is not limited to that in each of the embodiments.

Also, in each of the embodiments except the fourth embodiment (FIGS. 1 to 3, 5, 6, and 8 to 13), it has been described that the gate electrodes 31*b*, 32*b*, 33*b*, 41*b*, 42*b*, and 43*b* are provided so as to abut on respective sides of the switching elements 31, 32, 33, 41, 42, and 43, and also the drawings show that the gate electrodes 31*b*, 32*b*, 33*b*, 41*b*, 42*b*, and 43*b* abut on portions of respective perimeters of the switching elements 31, 32, 33, 41, 42, and 43 in plan view. Such description has been made in order to briefly explain an arrangement of gate electrodes, and it is needless to say that actually, a terminal structure region for obtaining a breakdown voltage is present around a switching element, and a gate electrode is provided inside the terminal structure region.

Further, though each of the embodiments has described a case in which the switching elements 31, 32, 33, 41, 42, and 43 are arranged in a matrix, a plurality of diode elements may be arranged in a matrix for an application in which a small voltage drop in a diode is requested.

While the invention has been shown and described in detail, the foregoing description is in all aspects illustrative and not restrictive. It is therefore understood that numerous modifications and variations can be devised without departing from the scope of the invention.

REFERENCE SIGNS LIST

1, 23, 25: insulating substrate, 2, 24, 26: metal pattern, 8*a*, 8*b*, 8*c*: main-current wire, 9*a*, 9*b*: gate wire, 27: gate auxiliary electrode, 28: collector main electrode, 29: emitter main electrode, 30: semiconductor module, 31, 32, 33, 41, 42, 43: switching element, 31*a*, 32*a*, 33*a*, 41*a*, 42*a*, 43*a*: second main electrode, 31*b*, 32*b*, 33*b*, 41*b*, 42*b*, 43*b*: gate electrode, 51, 52, 53: diode element, 51*a*, 52*a*, 53*a*: anode electrode, 10, 10A, 100, 200, 300, 400, 500, 600, 700, 800, 900, 1000, 1100, 1200: semiconductor device

The invention claimed is:

1. A semiconductor device comprising:
an insulating substrate;
a metal pattern which is a continuous piece and is bonded to one main surface of said insulating substrate;
a plurality of switching elements bonded to a surface opposite to said insulating substrate on said metal pattern, wherein
said plurality of switching elements are arranged in a matrix of two or more rows and two or more columns on said metal pattern,
each of said plurality of switching elements includes:
a first main electrode provided in one main surface which is bonded to said metal pattern;
a second main electrode provided in the other main surface opposite to said one main surface; and
at least one gate electrode provided in said other main surface, and
along one direction of a row direction and a column direction, said second main electrodes of said switching elements arranged adjacently are electrically connected by at least one main-current wire.

2. The semiconductor device according to claim 1, wherein
along the one direction of the row direction and the column direction, said gate electrodes of said switching elements arranged adjacently are bonded by a gate wire.

3. The semiconductor device according to claim 2, wherein said at least one gate electrode includes two gate electrodes which are provided so as to abut on said two opposed sides of said other main surface, respectively, and along the one direction of the row direction and the column direction, said plurality of switching elements are arranged such that said gate electrodes of said switching elements arranged adjacently are opposed to each other.

4. The semiconductor device according to claim 3, wherein
in said other main surface, said second main electrode is placed between said two gate electrodes, and said main-current wire is connected to said second main electrode.

5. The semiconductor device according to claim 4, wherein
a height of said main-current wire is greater than a height of said gate wire.

6. The semiconductor device according to claim 2, wherein
along the one direction of the row direction and the column direction, said gate electrodes of said switching elements arranged adjacently are connected by the gate wire, and
along the other direction of the row direction and the column direction, said second main electrodes of said switching elements arranged adjacently are connected by the main-current wire.

7. The semiconductor device according to claim 6, wherein
said gate wire and said main-current wire cross each other by a grade-separation method.

8. The semiconductor device according to claim 2, wherein
said gate electrode has a shape of a rectangle in plan view, and
a longer side of said gate electrode abuts on one side of said other main surface.

9. The semiconductor device according to claim 2, wherein
in some of said plurality of switching elements, for which cumulative lengths of said gate wires reaching said gate electrodes are identical to each other, respective electrical characteristics which affect switching speeds of said some switching elements are set such that said switching speeds are identical to each other.

10. The semiconductor device according to claim 9, wherein
said electrical characteristics include a gate threshold voltage or a saturation voltage between main electrodes.

11. The semiconductor device according to claim 2, wherein
the number of said main-current wires bonding said second main electrodes of said switching elements arranged adjacently increases along with advancement in the row direction or the column direction.

12. The semiconductor device according to claim 2, wherein
a diameter of said gate wire is smaller than a diameter of said main-current wire.

13. The semiconductor device according to claim 1, wherein
said gate electrode is provided at an equal distance from two opposed sides of said other main surface, and
said two opposed sides are parallel to said one direction.

14. The semiconductor device according to claim 1, further comprising
the same number of a plurality of diode elements as the number of the rows or the columns in said matrix, wherein
a sum of areas of said other main surfaces of said plurality of switching elements is larger than a sum of areas of upper surfaces of said plurality of diode elements.

15. The semiconductor device according to claim 14, wherein
said diode elements include a wide-band-gap semiconductor.

16. The semiconductor device according to claim 1, wherein
only said switching elements are semiconductor elements arranged on said metal pattern, and
diodes are incorporated in said switching elements.

17. The semiconductor device according to claim 1, wherein
said switching elements include a wide-band-gap semiconductor.

18. A semiconductor module comprising:
a plurality of semiconductor devices each of which is the semiconductor device as recited in claim 1; and
a base plate onto which said plurality of semiconductor devices are mounted.

* * * * *